(12) United States Patent
Wi et al.

(10) Patent No.: US 9,865,572 B2
(45) Date of Patent: Jan. 9, 2018

(54) DISPLAY DEVICE USING SEMICONDUCTOR LIGHT EMITTING DEVICE AND METHOD FOR MANUFACTURING

(71) Applicant: LG ELECTRONICS INC., Seoul (KR)

(72) Inventors: Kyoungtae Wi, Seoul (KR); Byungjoon Rhee, Seoul (KR); Bongchu Shim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 15/376,888

(22) Filed: Dec. 13, 2016

(65) Prior Publication Data

US 2017/0170152 A1 Jun. 15, 2017

(30) Foreign Application Priority Data

Dec. 14, 2015 (KR) ........................ 10-2015-0178470

(51) Int. Cl.
*H01L 25/075* (2006.01)
*H01L 27/15* (2006.01)
(Continued)

(52) U.S. Cl.
CPC ......... *H01L 25/0753* (2013.01); *H01L 24/29* (2013.01); *H01L 24/32* (2013.01); *H01L 24/95* (2013.01); *H01L 27/156* (2013.01); *H01L 33/38* (2013.01); *H01L 33/56* (2013.01); *H01L 33/60* (2013.01); *H01L 33/62* (2013.01);
(Continued)

(58) Field of Classification Search
CPC . H01L 25/0753; H01L 27/153; H01L 27/156; H01L 33/48; H01L 33/52; H01L 33/54; H01L 33/56; H01L 33/62
See application file for complete search history.

(56) References Cited

U.S. PATENT DOCUMENTS 6,087,680 A * 7/2000 Gramann ............ H01L 25/0753
257/91
2002/0190637 A1* 12/2002 Matsubara .............. H01L 33/56
313/503
(Continued)

FOREIGN PATENT DOCUMENTS

WO   WO 2014/163325 A1   10/2014

*Primary Examiner* — Bryan Junge
(74) *Attorney, Agent, or Firm* — Birch, Stewart, Kolasch & Birch, LLP

(57) ABSTRACT

A display device including a substrate including a wiring electrode; a conductive adhesive layer including an anisotropic conductive medium, and disposed to cover the wiring electrode; and a plurality of semiconductor light emitting devices adhered to the conductive adhesive layer and electrically connected to the wiring electrode through the anisotropic conductive medium. Further, the conductive adhesive layer includes a first layer disposed on the substrate; a second layer deposited on the first layer and including the anisotropic conductive medium; and a third layer deposited on the second layer, to which the semiconductor light emitting devices are adhered. Further, at least one of the second layer and the third layer includes a white pigment configured to reflect light emitted by the semiconductor light emitting device.

17 Claims, 15 Drawing Sheets

(51) Int. Cl.
  *H01L 23/00*    (2006.01)
  *H01L 33/38*    (2010.01)
  *H01L 33/60*    (2010.01)
  *H01L 33/62*    (2010.01)
  *H01L 33/56*    (2010.01)
  *H05K 3/32*     (2006.01)

(52) U.S. Cl.
  CPC ...... *H05K 3/323* (2013.01); *H01L 2224/2929* (2013.01); *H01L 2224/32225* (2013.01); *H01L 2924/07811* (2013.01); *H01L 2924/12041* (2013.01)

(56) References Cited

U.S. PATENT DOCUMENTS

| | | | |
|---|---|---|---|
| 2005/0155706 A1* | 7/2005 | Nishida | H01L 21/563 156/312 |
| 2005/0212406 A1* | 9/2005 | Daniels | F21K 9/90 313/503 |
| 2007/0290217 A1* | 12/2007 | Daniels | G02F 1/133603 257/88 |
| 2009/0114928 A1* | 5/2009 | Messere | B32B 17/10 257/88 |
| 2011/0266578 A1 | 11/2011 | Kanisawa et al. | |
| 2012/0018765 A1* | 1/2012 | Mizogami | H01L 33/42 257/99 |
| 2012/0112215 A1 | 5/2012 | Chai et al. | |
| 2012/0112220 A1* | 5/2012 | West | H01L 33/46 257/98 |
| 2014/0346684 A1* | 11/2014 | Kojima | H01L 24/32 257/783 |
| 2014/0355226 A1* | 12/2014 | Kim | H05K 3/323 361/749 |
| 2015/0249069 A1* | 9/2015 | Yoshida | H01L 33/62 257/89 |
| 2016/0211415 A1* | 7/2016 | Huang | H01L 24/00 |
| 2016/0260875 A1* | 9/2016 | Liang | G02F 1/29 |

\* cited by examiner

DISPLAY DEVICE USING SEMICONDUCTOR LIGHT EMITTING DEVICE AND METHOD FOR MANUFACTURING

CROSS-REFERENCE TO RELATED APPLICATIONS

This application claims the benefit of priority of Korean Patent Application No. 10-2015-0178470, filed on Dec. 14, 2015, which is herein incorporated by reference in its entirety.

BACKGROUND OF THE INVENTION

1. Field of the Invention

The present disclosure relates to a display device and a fabrication method thereof, and more particularly, to a flexible display device using a semiconductor light emitting device.

2. Description of the Related Art

In recent years, display devices having excellent characteristics such as low profile, flexibility and the like have been developed in the display technical field. Currently commercialized main displays include liquid crystal displays (LCDs) and active matrix organic light emitting diodes (AMOLEDs).

However, there exist problems such as a slow response time, difficult implementation of flexibility for LCDs, and there exist drawbacks such as short life span, a poor yield as well as a low flexibility for AMOLEDs. Further, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices can be used to implement a flexible display, thereby presenting a scheme for solving the problems.

A flexible display using the semiconductor light emitting device enhances a luminous efficiency of the semiconductor light emitting device, but the fabrication of the semiconductor light emitting device is complicated. Furthermore, providing an additional reflective layer complicates a relationship between surrounding structures.

SUMMARY OF THE INVENTION

Accordingly, one aspect of the present disclosure is to address the above-noted and other problems with the related art.

Another aspect of the present disclosure is to provide a structure of enhancing luminance in a display device and a method of fabricating the same.

Still another aspect of the present disclosure is to provide a display device of enhancing luminous efficiency even with a simple structure through a combination of an adhesive layer and white pigment.

To achieve these and other advantages and in accordance with the purpose of the present invention, as embodied and broadly described herein, the present invention provides in one aspect a display device including a substrate including a wiring electrode; a conductive adhesive layer including an anisotropic conductive medium, and disposed to cover the wiring electrode; and a plurality of semiconductor light emitting devices adhered to the conductive adhesive layer and electrically connected to the wiring electrode through the anisotropic conductive medium. Further, the conductive adhesive layer includes a first layer disposed on the substrate; a second layer deposited on the first layer and including the anisotropic conductive medium; and a third layer deposited on the second layer, to which the semiconductor light emitting devices are adhered. Further, at least one of the second layer and the third layer includes a white pigment configured to reflect light emitted by the semiconductor light emitting device. The present invention also provides a corresponding anisotropic conductive medium.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Figure 1:
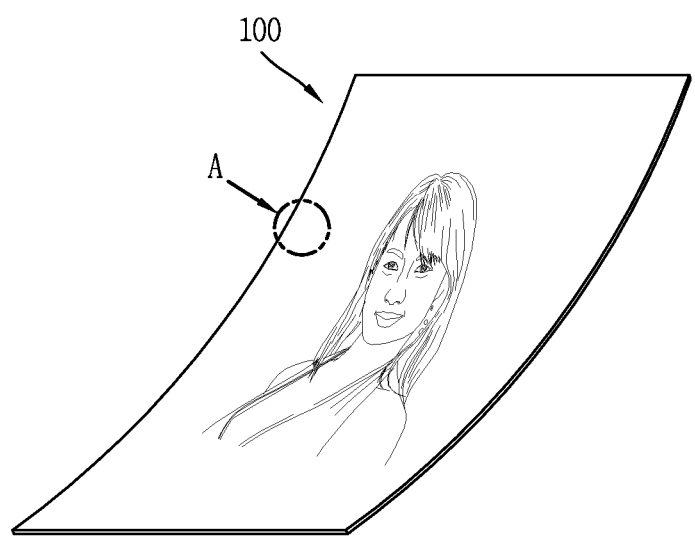
FIG. 1 is a conceptual view illustrating a display device using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

Furthermore, when an element such as a layer, region or substrate is referred to as being "on" another element, it can be directly on the other element or an intermediate element may also be interposed therebetween. A display device disclosed herein includes a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein is applicable to any displayable device even though it is a new product type which will be developed later.

FIG. 1 is a conceptual view illustrating a display device using a semiconductor light emitting device according to an embodiment of the present disclosure. In addition, information processed in the controller of the display device 100 can be displayed using a flexible display. The flexible display includes a flexible, bendable, twistable, foldable and rollable display. For example, the flexible display can be fabricated on a thin and flexible substrate that can be warped, bent, folded or rolled like a paper sheet while maintaining the display characteristics of a flat display.

In addition, a display area of the flexible display becomes a plane when the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information can be implemented by individually controlling the light emission of sub-pixels disposed in a matrix form. The sub-pixel denotes a minimum unit for implementing one color.

In addition, the sub-pixel of the flexible display can be implemented by a semiconductor light emitting device. According to an embodiment of the present disclosure, a light emitting diode (LED) is illustrated as a type of semiconductor light emitting device and can be formed with a small size to perform the role of a sub-pixel even in the second configuration.

Hereinafter, a flexible display implemented using the light emitting diode will be described in more detail with reference to the accompanying drawings. In particular, FIG. 2 is a partial enlarged view of portion "A" in FIG. 1, FIGS. 3A and 3B are cross-sectional views taken along lines B-B and C-C in FIG. 2, FIG. 4 is a conceptual view illustrating a flip-chip type semiconductor light emitting device in FIG. 3A, and FIGS. 5A through 5C are conceptual views illustrating various forms for implementing colors in connection with a flip-chip type semiconductor light emitting device.

Figure 2:
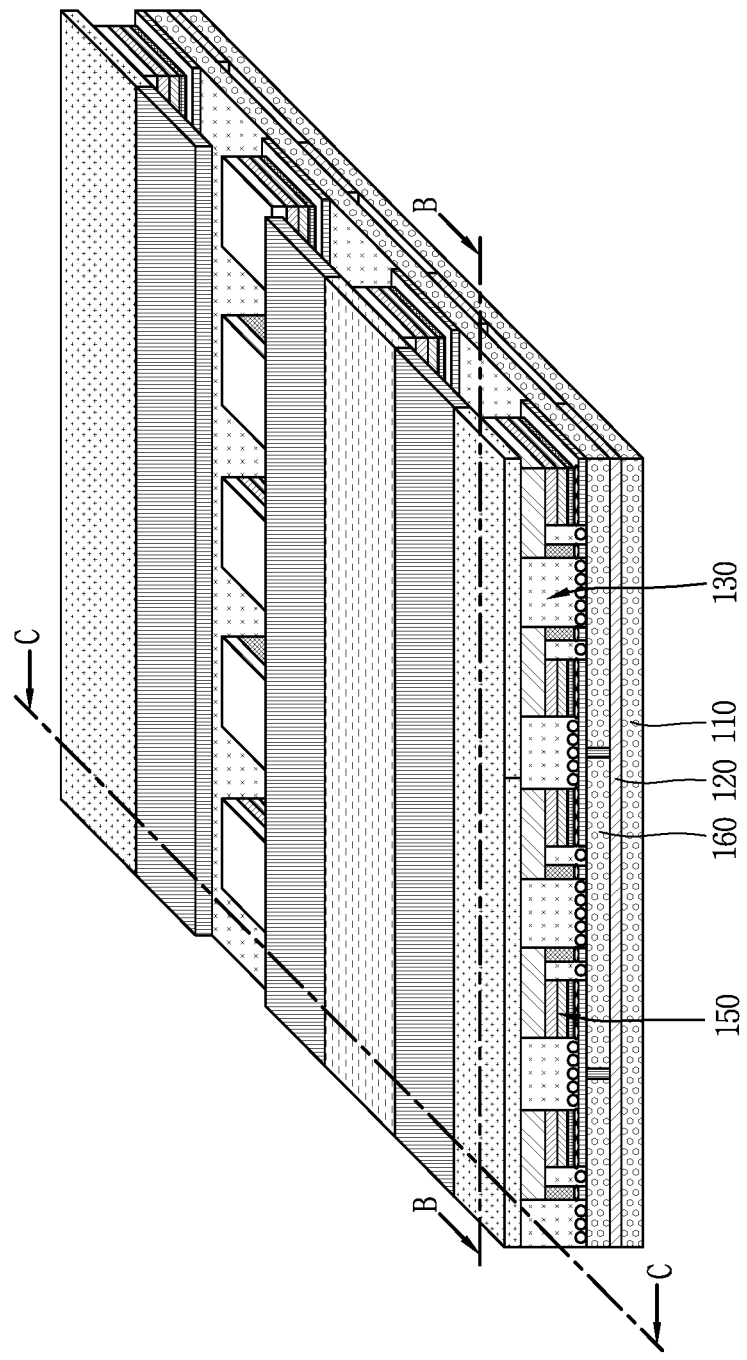
FIG. 2 is a partial enlarged view of portion "A" in FIG. 1.
Figure 3A:
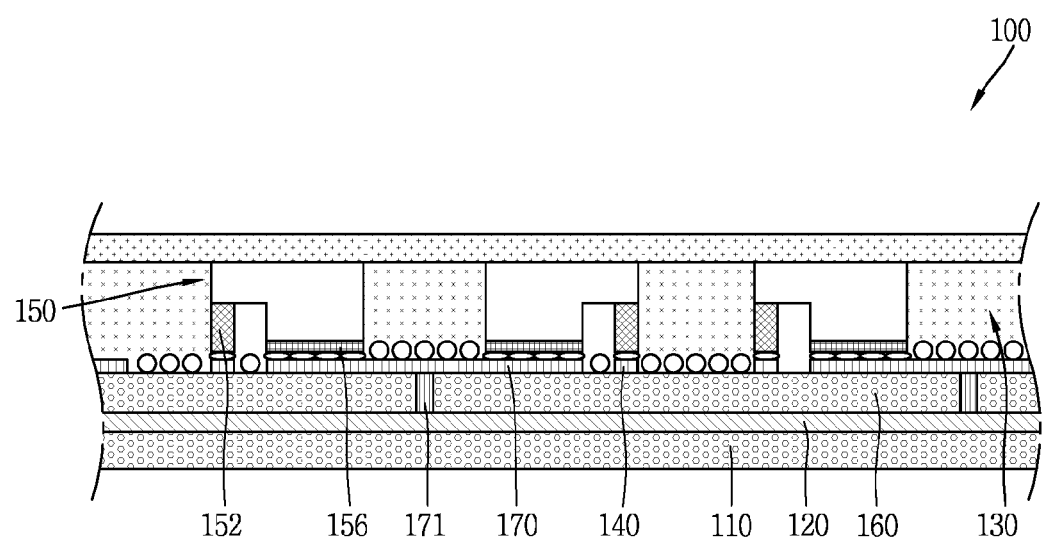
FIGS. 3A and 3B are cross-sectional views taken along lines B-B and C-C in FIG. 2.
Figure 3B:
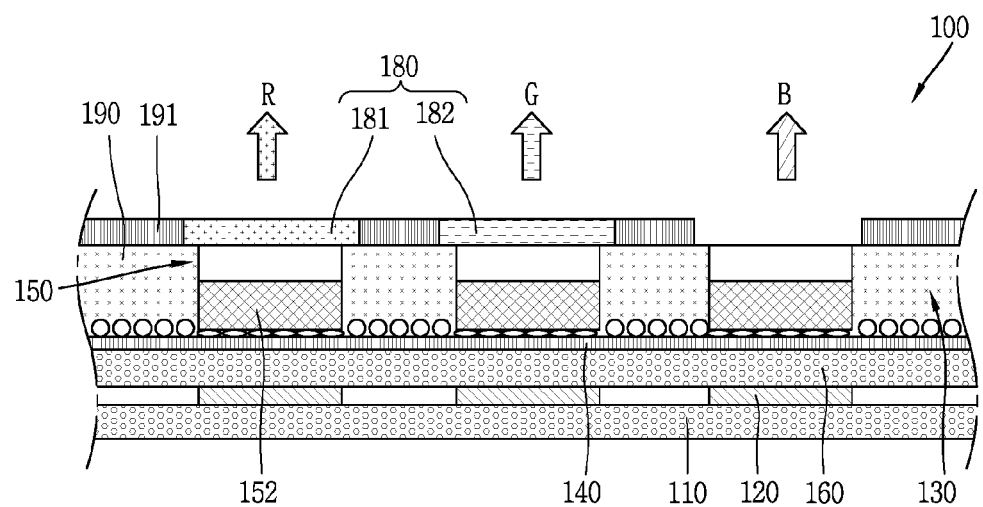
Figure 4:
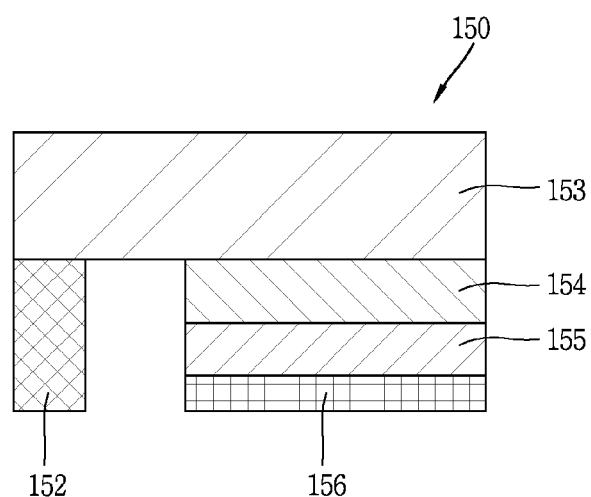
FIG. 4 is a conceptual view illustrating a flip-chip type semiconductor light emitting device in FIG. 3A.

FIGS. 2, 3A and 3B illustrate a display device 100 using a passive matrix (PM) type semiconductor light emitting device. However, the following illustration is also applicable to an active matrix (AM) type semiconductor light emitting device.

As shown, the display device 100 includes a substrate 110, a first electrode 120, a conductive adhesive layer 130, a second electrode 140, and a plurality of semiconductor light emitting devices 150. The substrate 110 may be a flexible substrate and contain glass or polyimide (PI) to implement the flexible display device. In addition, if it is a flexible material, any one such as polyethylene naphthalate (PEN), polyethylene terephthalate (PET) or the like may be used. The substrate 110 can also be either one of transparent and non-transparent materials.

In addition, the substrate 110 may be a wiring substrate disposed with the first electrode 120, and thus the first electrode 120 may be placed on the substrate 110. In addition, an insulating layer 160 is disposed on the substrate 110 placed with the first electrode 120, and an auxiliary electrode 170 is placed on the insulating layer 160. In this instance, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form single wiring substrate.

Further, the auxiliary electrode 170 as an electrode for electrically connecting the first electrode 120 to the semiconductor light emitting device 150 is placed on the insulating layer 160, and is disposed to correspond to the location of the first electrode 120. For example, the auxiliary electrode 170 has a dot shape, and may be electrically connected to the first electrode 120 by an electrode hole 171 passing through the insulating layer 160. The electrode hole 171 may be formed by filling a conductive material in a via hole.

Further, the conductive adhesive layer 130 may be formed on one surface of the insulating layer 160, but the present disclosure is not limited to this. For example, it is also possible to have the conductive adhesive layer 130 disposed on the substrate 110 with no insulating layer 160. In addition, the conductive adhesive layer 130 may perform the role of an insulating layer in the structure in which the conductive adhesive layer 130 is disposed on the substrate 110.

The conductive adhesive layer 130 can also be a layer having adhesiveness and conductivity, and a conductive material and an adhesive material may be mixed on the conductive adhesive layer 130. The conductive adhesive layer 130 may also have flexibility, thereby allowing a flexible function in the display device.

For example, the conductive adhesive layer 130 can be an anisotropic conductive film (ACF), an anisotropic conductive paste, a solution containing conductive particles, and the like. The conductive adhesive layer 130 can allow electrical interconnection in the z-direction passing through the thickness thereof, but be configured as a layer having electrical insulation in the horizontal x-y direction thereof. Accordingly, the conductive adhesive layer 130 may be referred to as a z-axis conductive layer (hereinafter referred to as a "conductive adhesive layer").

Further, the anisotropic conductive film includes an anisotropic conductive medium mixed with an insulating base member, and thus when heat and pressure are applied thereto, only a specific portion thereof has conductivity by the anisotropic conductive medium. Hereinafter, heat and pressure are applied to the anisotropic conductive film, but other methods are also available for the anisotropic conductive film to partially have conductivity. The methods include applying only either one of heat and pressure thereto, UV curing, and the like.

In addition, the anisotropic conductive medium may be conductive balls or particles. In the present embodiment, the anisotropic conductive film includes an anisotropic conductive medium mixed with an insulating base member, and thus when heat and pressure are applied thereto, only a specific portion thereof has conductivity by the conductive balls. The anisotropic conductive film may also include a core with a conductive material containing a plurality of particles coated by an insulating layer with a polymer material, and have conductivity by the core while breaking an insulating layer on a portion to which heat and pressure are applied. Here, a core can be transformed to implement a layer having both surfaces to which objects contact in the thickness direction of the film.

For a more specific example, heat and pressure are applied to an anisotropic conductive film as a whole, and electrical connection in the z-axis direction is partially formed by a height difference from a mating object adhered by the use of the anisotropic conductive film. In another example, an anisotropic conductive film may include a plurality of particles in which a conductive material is coated on insulating cores.

In this instance, a portion to which heat and pressure are applied is converted (pressed and adhered) to a conductive material to have conductivity in the thickness direction of the film. In still another example, to the film can have conductivity in the thickness direction of the film in which a conductive material passes through an insulating base member in the z-direction. In this instance, the conductive material may have a pointed end portion.

In addition, the anisotropic conductive film may be a fixed array anisotropic conductive film (ACF) including conductive balls inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure is not limited to this, and the anisotropic conductive film may include conductive balls randomly mixed with an insulating base member or include a plurality of layers in which conductive balls are disposed at any one layer (double-ACF), and the like. The anisotropic conductive paste can also be a paste in which conductive balls are mixed with an insulating and adhesive base material. Furthermore, a solution containing conductive particles may contain conductive particles or nano particles.

Referring to the drawing again, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140. When the conductive adhesive layer 130 is formed when the auxiliary electrode 170 and second electrode 140 are located, and then the semiconductor light emitting device 150 is connect thereto in a flip chip form with the application of heat and pressure, the semiconductor light emitting device 150 is electrically connected to the first electrode 120 and second electrode 140.

Referring to FIG. 4, the semiconductor light emitting device 150 may be a flip chip type semiconductor light emitting device. For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this instance, the p-type electrode 156 can be electrically connected to a welding portion by the conductive adhesive layer 130, and the n-type electrode 152 can be electrically connected to the second electrode 140.

Referring again to FIGS. 2, 3A and 3B, the auxiliary electrode 170 is formed in an elongated manner in one direction to be electrically connected to a plurality of semiconductor light emitting devices 150. For example, the left and right p-type electrodes of the semiconductor light emitting devices 150 around the auxiliary electrode 170 can be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. Furthermore, a plurality of semiconductor light emitting devices 150 constitute a light-emitting array, and a phosphor layer 180 is formed on the light-emitting array.

The light emitting device may include a plurality of semiconductor light emitting devices with different self luminance values. Each of the semiconductor light emitting devices 150 constitutes a sub-pixel, and is electrically connected to the first electrode 120. For example, a plurality of first electrodes 120 can be used, the semiconductor light emitting devices can be arranged in several rows, and each row of the semiconductor light emitting devices can be electrically connected to any one of the plurality of first electrodes.

Further, the semiconductor light emitting devices can be connected in a flip chip form, and thus semiconductor light emitting devices grown on a transparent dielectric substrate. The semiconductor light emitting devices may be nitride semiconductor light emitting devices, for instance. The semiconductor light emitting device 150 also has an excellent luminance characteristic, and thus it is possible to configure individual sub-pixels even with a small size thereof.

In addition, a partition wall 190 can be formed between the semiconductor light emitting devices 150 and divide individual sub-pixels from one another, and be formed as an integral body with the conductive adhesive layer 130. For example, a base member of the anisotropic conductive film can form the partition wall when the semiconductor light emitting device 150 is inserted into the anisotropic conductive film.

Furthermore, when the base member of the anisotropic conductive film is black, the partition wall 190 has reflective characteristics while at the same time increasing contrast with no additional black insulator. In another example, a reflective partition wall may be separately provided with the partition wall 190. In this instance, the partition wall 190 may include a black or white insulator according to the purpose of the display device and enhance reflectivity when the partition wall of the while insulator is used, and increase contrast while at the same time having reflective characteristics.

Further, the phosphor layer 180 may be located at an outer surface of the semiconductor light emitting device 150. For example, the semiconductor light emitting device 150 is a blue semiconductor light emitting device that emits blue (B) light, and the phosphor layer 180 converts the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light can be deposited on the blue semiconductor light emitting device 151 at a location implementing a red sub-pixel, and a green phosphor 182 capable of converting blue light into green (G) light can be deposited on the blue semiconductor light emitting device 151 at a location implementing a green sub-pixel. Furthermore, only the blue semiconductor light emitting device 151 may be solely used at a location implementing a blue sub-pixel. In this instance, the red (R), green (G) and blue (B) sub-pixels may implement one pixel.

More specifically, one color phosphor can be deposited along each line of the first electrode 120. Accordingly, one line on the first electrode 120 can be an electrode controlling one color. In other words, red (R), green (B) and blue (B) may be sequentially disposed, thereby implementing sub-pixels. However, the present disclosure is not limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance. However, the present disclosure is not limited to this, and another structure for implementing blue, red and green may be also applicable thereto.

Figure 5A:
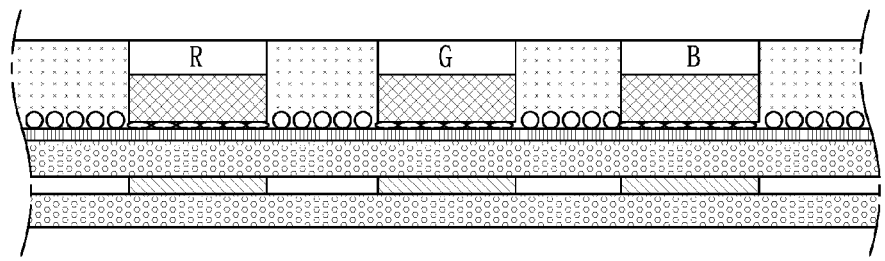
FIGS. 5A through 5C are conceptual views illustrating various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto. In this instance, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by the red, green and blue semiconductor light emitting devices, thereby implementing a full color display.

Figure 5B:
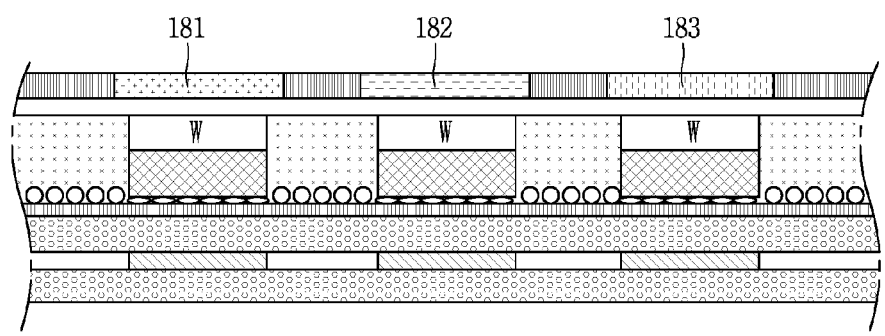

Referring to FIG. 5B, the semiconductor light emitting device may have a white light emitting device (W) provided with a yellow phosphor layer for each element. In this instance, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
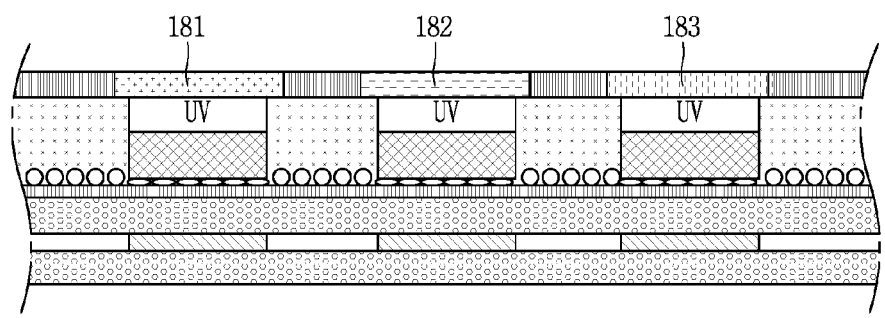

Referring to FIG. 5C, it is possible to also have a structure in which a red phosphor layer 181, a green phosphor layer 182 and blue phosphor layer 183 are provided on a ultra violet light emitting device (UV). Thus, the semiconductor light emitting device can be used over the entire region up to ultra violet (UV) as well as visible light, and can be a semiconductor light emitting device in which ultra violet (UV) can be used as an excitation source.

Taking the present example into consideration again, the semiconductor light emitting device 150 is placed on the conductive adhesive layer 130 to configure a sub-pixel in the display device. The semiconductor light emitting device 150 has excellent luminance characteristics, and thus it is possible to configure individual sub-pixels even with a small size thereof. Further, the size of the individual semiconductor light emitting device 150 may be less than 80 μm in the length of one side thereof, and formed with a rectangular or square shaped element. For a rectangular shaped element, the size thereof may be less than 20×80 μm.

In addition, even when a square shaped semiconductor light emitting device 150 with a length of side of 10 μm is used for a sub-pixel, it will exhibit a sufficient brightness for implementing a display device. Accordingly, for example, for a rectangular pixel in which one side of a sub-pixel is 600 μm in size, and the remaining one side thereof is 300 μm, a relative distance between the semiconductor light emitting devices becomes sufficiently large. Accordingly, in this instance, it is possible to implement a flexible display device having a HD image quality.

Figure 6:
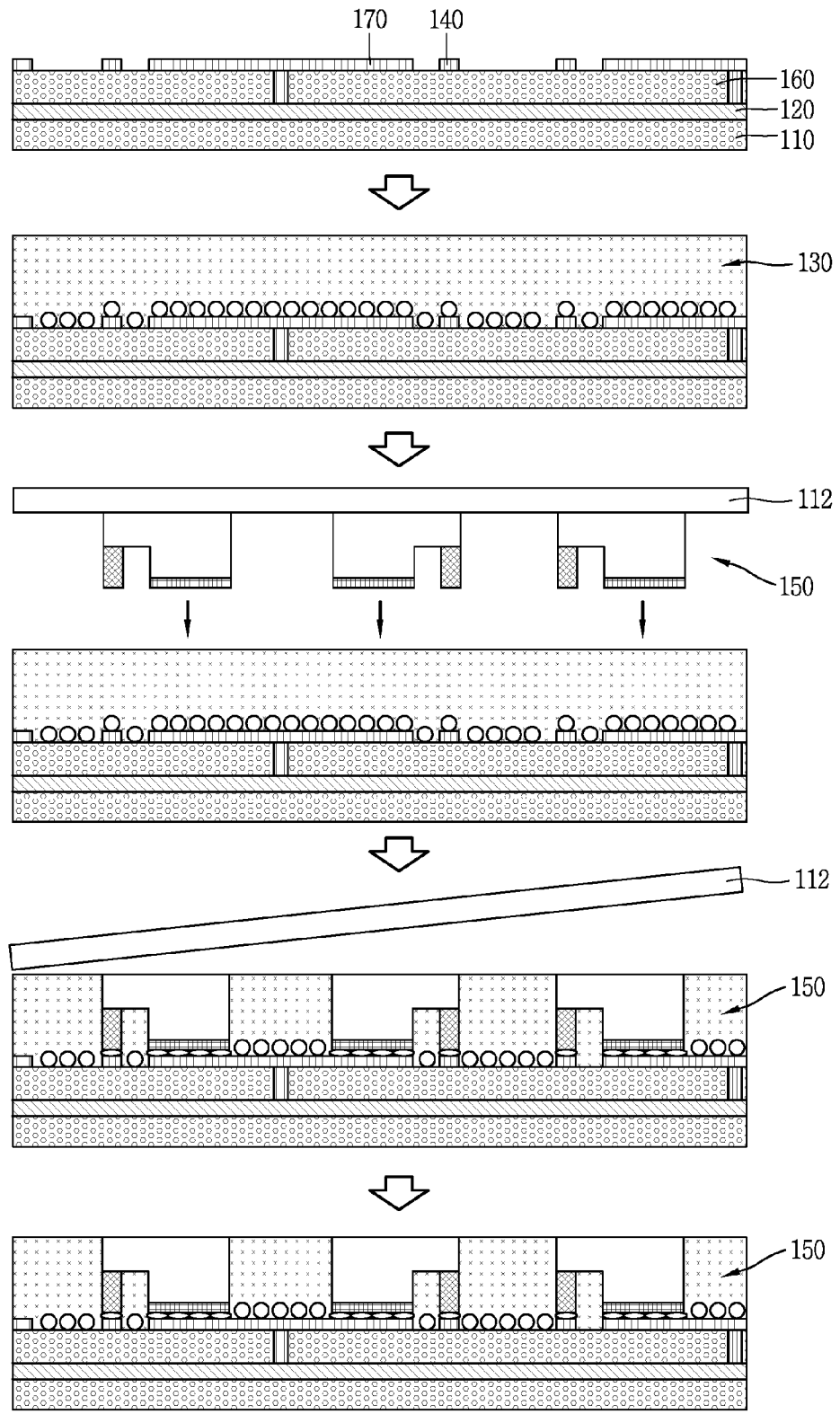
FIG. 6 is cross-sectional views illustrating a fabrication method of a display device using a semiconductor light emitting device according to an embodiment of the present disclosure.

A display device using the foregoing semiconductor light emitting device can be fabricated by a novel type of fabrication method described with reference to FIG. 6. In particular, FIG. 6 is cross-sectional views illustrating a method of fabricating a display device using a semiconductor light emitting device according to an embodiment of the present disclosure.

As shown, the conductive adhesive layer 130 is formed on the insulating layer 160 located with the auxiliary electrode 170 and second electrode 140. Further, the insulating layer 160 is deposited on the first substrate 110 to form one substrate (or wiring substrate), and the first electrode 120, auxiliary electrode 170 and second electrode 140 are disposed at the wiring substrate. In this instance, the first electrode 120 and second electrode 140 may be disposed in a perpendicular direction to each other.

In addition, the first substrate 110 and insulating layer 160 may contain glass or polyimide (PI), respectively, to implement a flexible display device. The conductive adhesive layer 130 may also be implemented by an anisotropic conductive film, for example, and thus, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140. In this instance, the second substrate 112 as a growth substrate for growing the semiconductor light emitting device 150 can be a sapphire substrate or silicon substrate. The semiconductor light emitting device also has a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. As discussed above, only a portion between the semiconductor light emitting device 150 and the auxiliary electrode 170 and second electrode 140 can have conductivity due to the characteristics of an anisotropic conductive film having conductivity by thermal compression, thereby allowing the electrodes and semiconductor light emitting device 150 to be electrically connected to each other. Further, the semiconductor light emitting device 150 is inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method. Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer.

Furthermore, a phosphor layer can be formed on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The fabrication method or structure of a display device using the foregoing semiconductor light emitting device may be modified in various forms. For example, the foregoing display device may be applicable to a vertical semiconductor light emitting device. Hereinafter, the vertical structure will be described with reference to FIGS. 5 and 6.

Figure 7:
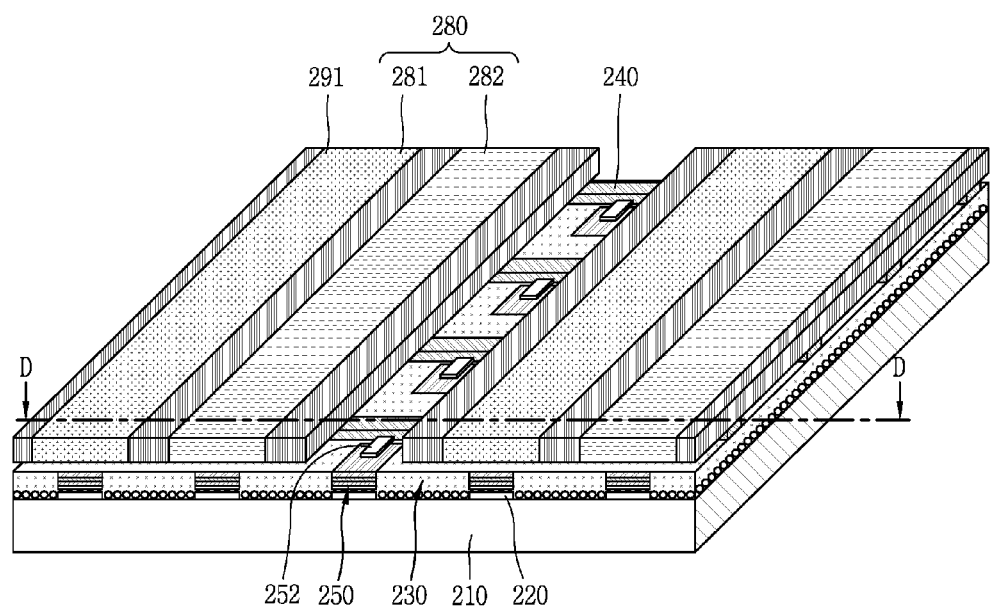
FIG. 7 is a perspective view illustrating a display device using a semiconductor light emitting device according to another embodiment of the present disclosure.
Figure 8:
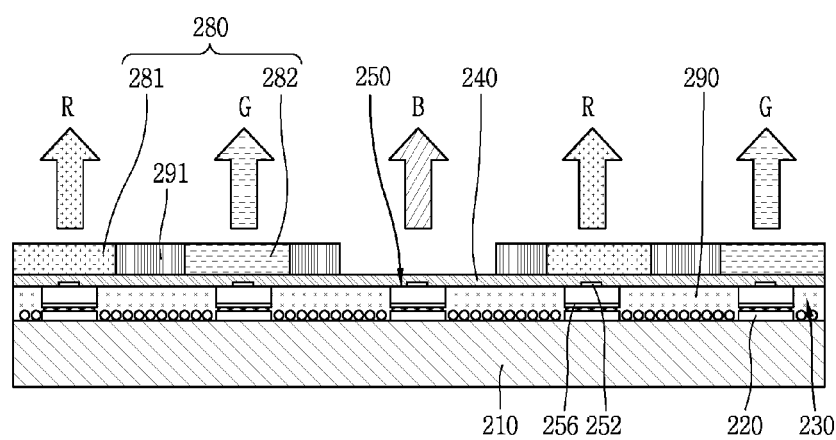
FIG. 8 is a cross-sectional view taken along line D-D in FIG. 7.
Figure 9:
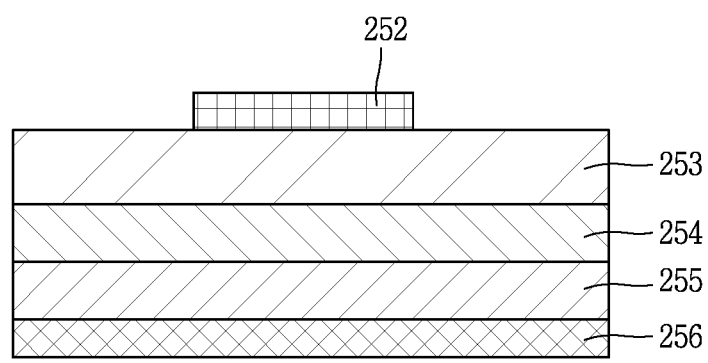
FIG. 9 is a conceptual view illustrating a vertical type semiconductor light emitting device in FIG. 8.

Next, FIG. 7 is a perspective view illustrating a display device using a semiconductor light emitting device according to another embodiment of the present disclosure, FIG. 8 is a cross-sectional view taken along line C-C in FIG. 7, and FIG. 9 is a conceptual view illustrating a vertical type semiconductor light emitting device in FIG. 8. According to the drawings, the display device can use a passive matrix (PM) type of vertical semiconductor light emitting device.

As shown, the display device includes a substrate 210, a first electrode 220, a conductive adhesive layer 230, a second electrode 240 and a plurality of semiconductor light emitting devices 250. The substrate 210 as a wiring substrate disposed with the first electrode 220 may include polyimide (PI) to implement a flexible display device. In addition, any material may be used if it is an insulating and flexible material.

In addition, the first electrode 220 is located on the substrate 210, and formed with a bar-shaped electrode elongated in one direction. The first electrode 220 may also be a data electrode. Further, the conductive adhesive layer 230 is formed on the substrate 210 located with the first electrode 220. Similarly to a display device to which a flip chip type light emitting device is applied, the conductive adhesive layer 230 may be an anisotropic conductive film (ACF), an anisotropic conductive paste, a solution containing conductive particles, and the like. However, the present embodiment illustrates the conductive adhesive layer 230 is implemented by an anisotropic conductive film.

When an anisotropic conductive film is located when the first electrode 220 is located on the substrate 210, and then heat and pressure are applied to connect the semiconductor light emitting device 250 thereto, the semiconductor light emitting device 250 is electrically connected to the first electrode 220. Further, the semiconductor light emitting device 250 is preferably disposed on the first electrode 220.

In addition, the electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Further, the anisotropic conductive film contains an adhesive component, and thus the conductive adhesive layer 230 implements a mechanical coupling as well as an electrical coupling between the semiconductor light emitting device 250 and the first electrode 220. Thus, the semiconductor light emitting device 250 is placed on the conductive adhesive layer 230, thereby configuring a separate sub-pixel in the display device.

As discussed above, the semiconductor light emitting device 250 has excellent luminance characteristics, and thus it is possible to configure individual sub-pixels even with a small size thereof. The size of the individual semiconductor light emitting device 250 may be less than 80 μm in the length of one side thereof, and formed with a rectangular or square shaped element. In case of a rectangular shaped element, the size thereof may be less than 20×80 μm.

The semiconductor light emitting device 250 may be a vertical structure. A plurality of second electrodes 240 disposed in a direction of crossing the length direction of the first electrode 220, and electrically connected to the vertical semiconductor light emitting device 250 may also be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this instance, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes are disposed in the upward/downward direction in the vertical semiconductor light emitting device 250, thereby providing a great advantage capable of reducing the chip size.

Referring to FIG. 8 again, a phosphor layer 280 is formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this instance, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a location implementing a red sub-pixel, and a green phosphor 282 capable of converting blue light into green (G) light may be deposited on the blue semiconductor light emitting device 251 at a location implementing a green sub-pixel. Furthermore, only the blue semiconductor light emitting device 251 may be solely used at a location implementing a blue sub-pixel. In this instance, the red (R), green (G) and blue (B) sub-pixels may implement one pixel.

However, the present disclosure is not limited to this, and another structure for implementing blue, red and green may be also applicable thereto as described above in a display device to which a flip chip type light emitting device is applied.

In addition, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 can be located between the semiconductor light emitting devices 250. The second electrode can also be formed with a bar-shaped electrode elongated in one direction, and disposed in a perpendicular direction to the first electrode.

Further, the second electrode 240 is electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least part of the ohmic electrode by printing or deposition. Through this, the second electrode 240 can be electrically connected to the n-type electrode of the semiconductor light emitting device 250.

In addition, the second electrode 240 is located on the conductive adhesive layer 230. A transparent insulating layer containing silicon oxide (SiOx) may also be formed on the substrate 210 formed with the semiconductor light emitting device 250. When the transparent insulating layer is formed and then the second electrode 240 is placed thereon, the second electrode 240 can be located on the transparent insulating layer. The second electrode 240 can also be formed to be separated from the conductive adhesive layer 230 or transparent insulating layer.

If a transparent electrode such as indium tin oxide (ITO) is used to locate the second electrode 240 on the semiconductor light emitting device 250, the ITO material has bad adhesiveness with an n-type semiconductor. Accordingly, the second electrode 240 can be placed between the semiconductor light emitting devices 250, thereby obtaining an advantage in which the transparent electrode is not required. Accordingly, an n-type semiconductor layer and a conductive material having a good adhesiveness can be used as a horizontal electrode without being restricted by the selection of a transparent material, thereby enhancing the light extraction efficiency.

In addition, a partition wall 290 is formed between the semiconductor light emitting devices 250. In other words, the partition wall 290 is disposed between the vertical semiconductor light emitting devices 250 to isolate the semiconductor light emitting device 250 constituting individual pixels. Thus, the partition wall 290 divides individual sub-pixels from one another, and can be formed as an integral body with the conductive adhesive layer 230. For example, a base member of the anisotropic conductive film can form the partition wall when the semiconductor light emitting device 250 is inserted into the anisotropic conductive film.

Furthermore, when the base member of the anisotropic conductive film is black, the partition wall 290 can have reflective characteristics while at the same time increasing contrast with no additional black insulator. In another example, a reflective partition wall can be separately provided with the partition wall 290 and include a black or white insulator.

If the second electrode 240 is precisely located on the conductive adhesive layer 230 between the semiconductor light emitting devices 250, the partition wall 290 can be located between the semiconductor light emitting device 250 and second electrode 240. Accordingly, individual sub-pixels can be configured even with a small size using the semiconductor light emitting device 250, and a distance between the semiconductor light emitting devices 250 can be relatively sufficiently large to place the second electrode 240 between the semiconductor light emitting devices 250, thereby having the effect of implementing a flexible display device having a HD image quality. Furthermore, In addition, a black matrix 291 is disposed between each phosphor layer to enhance contrast. In other words, the black matrix 191 can enhance the contrast of luminance.

As described above, the semiconductor light emitting device 250 is located on the conductive adhesive layer 230, thereby constituting individual pixels on the display device. Since the semiconductor light emitting device 250 has excellent luminance characteristics, thereby configuring individual sub-pixels even with a small size thereof. As a result, it is possible to implement a full color display in which the sub-pixels of red (R), green (G) and blue (B) implement one pixel by the semiconductor light emitting device.

Figure 10:
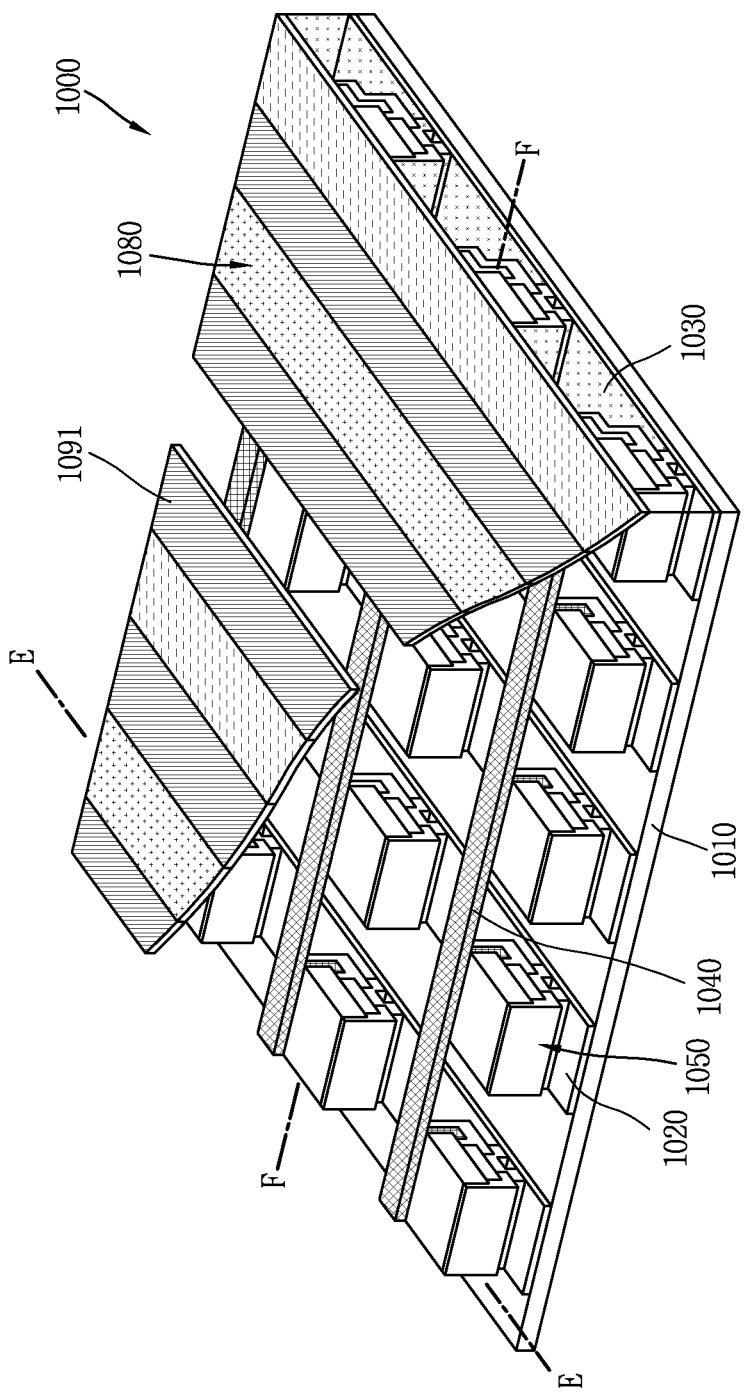
FIG. 10 is an enlarged view illustrating portion "A" in FIG. 1 illustrating another embodiment of the present disclosure to which a novel type semiconductor light emitting device is applied.
Figure 11A:
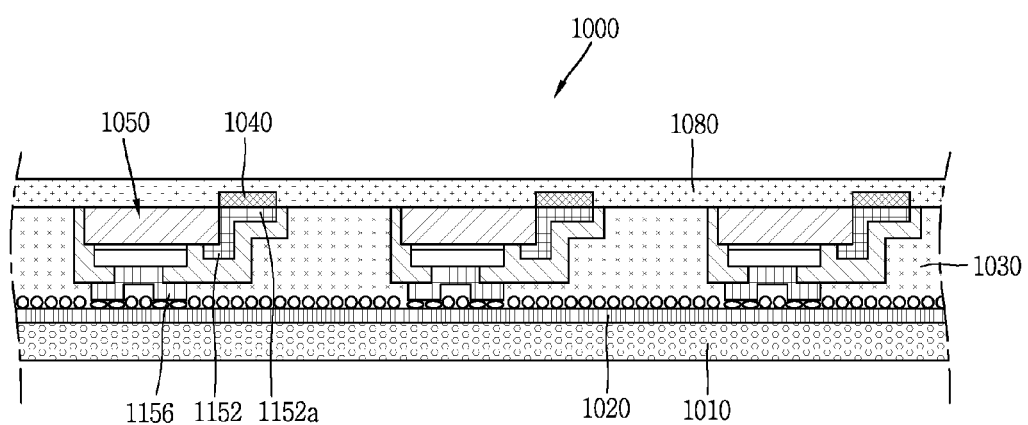
FIG. 11A is a cross-sectional view taken along line E-E in FIG. 10.
Figure 11B:
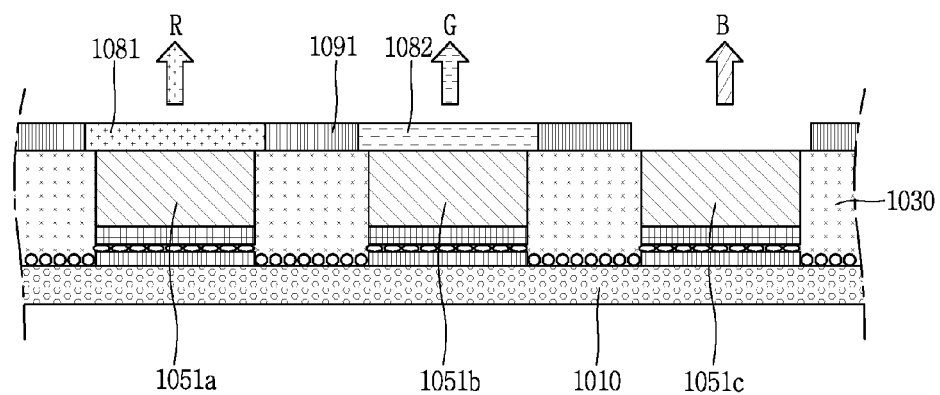
FIG. 11B is a cross-sectional view taken along line F-F in FIG. 10.
Figure 12:
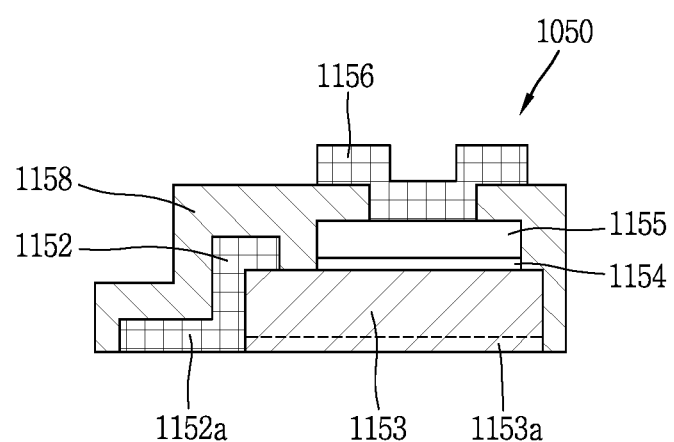
FIG. 12 is a conceptual view illustrating a flip chip type semiconductor light emitting device in FIG. 11A.

Next, FIG. 10 is an enlarged view illustrating portion "A" in FIG. 1 according to another embodiment of the present disclosure to which a novel type semiconductor light emitting device is applied, FIG. 11A is a cross-sectional view taken along line E-E in FIG. 10, FIG. 11B is a cross-sectional view taken along line F-F in FIG. 10, and FIG. 12 is a conceptual view illustrating a flip chip type semiconductor light emitting device in FIG. 11A.

In particular, FIGS. 10, 11A and 11B illustrate a display device 1000 using a passive matrix (PM) type semiconductor light emitting device. However, an example described below is also applicable to an active matrix (AM) type semiconductor light emitting device.

As shown, the display device 1000 includes a substrate 1010, a first electrode 1020, a conductive adhesive layer 1030, a second electrode 1040 and a plurality of semiconductor light emitting devices 1050. Here, the first electrode 1020 and second electrode 1040 may include a plurality of electrode lines, respectively.

The substrate 1010 as a wiring substrate on which the first electrode 1020 is disposed may include polyimide (PI) to implement a flexibly display device. In addition, any material may be used for the substrate 1010 if it is an insulating and flexible material. The first electrode 1020 is located on the substrate 1010, and formed with a bar-shaped electrode elongated in one direction. The first electrode 1020 can also be a data electrode.

Further, the conductive adhesive layer 1030 is formed on the substrate 1010 located with the first electrode 1020. As discussed above, the conductive adhesive layer 1030 may be an anisotropic conductive film (ACF), an anisotropic conductive paste, a solution containing conductive particles, and the like. However, according to the present embodiment, the conductive adhesive layer 1030 may be replaced by an adhesive layer. For example, when the first electrode 1020 is not located on the substrate 1010 but integrally formed with a conductive electrode of the semiconductor light emitting device, the conductivity of the adhesive layer may not be required.

In addition, a plurality of second electrodes 1040 disposed in a direction of crossing the length direction of the first electrode 1020, and electrically connected to the vertical semiconductor light emitting device 1050 are located between the semiconductor light emitting devices. In addition, the second electrode 1040 is located on the conductive adhesive layer 1030. In other words, the conductive adhesive layer 1030 is disposed between a wiring substrate and the second electrode 1040. The second electrode 1040 can thus be electrically connected to the semiconductor light emitting device 1050 through contact.

According to the foregoing structure, a plurality of semiconductor light emitting devices 1050 are coupled to the conductive adhesive layer 1030, and electrically connected to the first electrode 1020 and second electrode 1040. Further, a transparent insulating layer containing silicon oxide (SiOx) may be formed on the substrate 1010 formed with the semiconductor light emitting device 1050. When the transparent insulating layer is formed and then the second electrode 1040 is placed thereon, the second electrode 1040 can be located on the transparent insulating layer. The second electrode 1040 can also be formed to be separated from the conductive adhesive layer 1030 or transparent insulating layer.

As illustrated in the drawing, the plurality of semiconductor light emitting devices 1050 form a plurality of columns in a direction in parallel to a plurality of electrode lines provided in the first electrode 1020. However, the present disclosure is not limited to this. For example, the plurality of semiconductor light emitting devices 1050 can form a plurality of columns along the second electrode 1040.

Moreover, the display device 1000 may further include a phosphor layer 1080 formed on one surface of the plurality of semiconductor light emitting devices 1050. For example, the semiconductor light emitting device 1050 is a blue semiconductor light emitting device that emits blue (B) light, and the phosphor layer 1080 performs the role of converting the blue (B) light into the color of a sub-pixel. The phosphor layer 1080 may be a red phosphor layer 1081 or green phosphor layer 1082 constituting individual pixels. In other words, a red phosphor 1081 capable of converting blue light into red (R) light can be deposited on the blue semiconductor light emitting device 1051*a* at a location implementing a red sub-pixel, and a green phosphor 1082 capable of converting blue light into green (G) light can be deposited on the blue semiconductor light emitting device 1051*b* at a location implementing a green sub-pixel.

Furthermore, only the blue semiconductor light emitting device 1051*c* can be solely used at a location implementing a blue sub-pixel. In this instance, the red (R), green (G) and blue (B) sub-pixels can implement one pixel. More specifically, one color phosphor can be deposited along each line of the first electrode 1020. Accordingly, one line on the first electrode 1020 can be an electrode controlling one color. In other words, red (R), green (B) and blue (B) can be sequentially disposed along the second electrode 1040, thereby implementing sub-pixels. However, the present disclosure is not limited to this, and the semiconductor light emitting device 1050 may be combined with a quantum dot (QD) instead of a phosphor to implement sub-pixels such as red (R), green (G) and blue (B).

Further, the display device may further include a black matrix 1091 disposed between each phosphor to enhance the contrast of the phosphor layer 1080. The black matrix 1091 may be formed so a gap is made between phosphor dots, and a black material fills into the gap. Thus, the black matrix 1091 can enhance the contrast between light and shade while at the same time absorbing external light reflection. In addition, the black matrix 1091 is located between each phosphor along the first electrode 1020 in a direction on which the phosphor layer 1080 is deposited. In this instance, a phosphor layer is not formed at a location corresponding to the blue semiconductor light emitting device 1051, but black matrices can be formed at both sides by interposing a space with no the phosphor layer therebetween (or interposing the blue semiconductor light emitting device 1051*c* therebetween).

Again, referring to the semiconductor light emitting device 1050 according to the present example, electrodes are disposed at the top/bottom, thereby having an advantage of reducing the chip size. That, in this embodiment of the present disclosure, the electrodes are disposed at both the top/bottom, but the semiconductor light emitting device is a flip chip type light emitting device.

Referring to FIG. 12, for example, the semiconductor light emitting device 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

More specifically, the first conductive electrode 1156 and first conductive semiconductor layer 1155 may be a p-type electrode and a p-type semiconductor layer, respectively, and the second conductive electrode 1152 and second conductive semiconductor layer 1153 may be an n-type electrode and an n-type semiconductor layer, respectively. However, the present disclosure is not limited to this, and includes the first conductive type is an n-type and the second conductive type is a p-type.

More specifically, the first conductive electrode 1156 is formed on one surface of the first conductive semiconductor layer 1155, and the active layer 1154 is formed between the other surface of the first conductive semiconductor layer 1155 and one surface of the second conductive semiconductor layer 1153, and the second conductive electrode 1152 is formed on one surface of the second conductive semiconductor layer 1153.

In this instance, the second conductive electrode 1152 can be disposed on one surface of the second conductive semiconductor layer 1153, and an undoped semiconductor layer 1153*a* can be formed on the other surface of the second conductive semiconductor layer 1153.

Referring to FIG. 12 along with FIGS. 10 through 11B, one surface of the second conductive semiconductor layer can be a surface which is the closest to the wiring substrate, and the other surface of the second conductive semiconductor layer can be a surface which is the farthest surface from the wiring substrate. Further, the first conductive electrode 1156 and second conductive electrode 1152 are formed to have a height difference in the width direction and vertical direction (or thickness direction) at a separated position along the width direction of the semiconductor light emitting device.

In addition, the second conductive electrode 1152 is formed on the second conductive semiconductor layer 1153 using the height difference, but disposed adjacent to the second electrode 1040 located at an upper side of the semiconductor light emitting device. For example, at least part of the second conductive electrode 1152 protrudes along the width direction from a lateral surface of the second conductive semiconductor layer 1153 (or lateral surface of the undoped semiconductor layer 1153*a*). Thus, since the second conductive electrode 1152 protrudes from the lateral surface, the second conductive electrode 1152 can be exposed to an upper side of the semiconductor light emitting device. Thus, the second conductive electrode 1152 is disposed at a position overlapping with the second electrode 1040 disposed at an upper side of the conductive adhesive layer 1030.

More specifically, the semiconductor light emitting device includes a protrusion portion 1152a extended from the second conductive electrode 1152, and protruded from a lateral surface of the plurality of semiconductor light emitting devices. In this instance, based on the protrusion portion 1152a, the first conductive electrode 1156 and second conductive electrode 1152 are disposed at a separated position along the protrusion direction of the protrusion portion 1152a, and formed to have a height difference from each other in a direction perpendicular to the protrusion direction.

The protrusion portion 1152a is extended from one surface of the second conductive semiconductor layer 1153 to a lateral surface thereof, and extended to an upper surface of the second conductive semiconductor layer 1153, more particularly, the undoped semiconductor layer 1153a. The protrusion portion 1152a protrudes along the width direction from a lateral surface of the undoped semiconductor layer 1153a. Accordingly, the protrusion portion 1152a can be electrically connected to the second electrode 1040 at an opposite side to the first conductive electrode based on the second semiconductor layer.

The structure having the protrusion portion 1152a may be implemented in the foregoing horizontal and vertical semiconductor light emitting devices. Fine grooves can also be formed by roughing on an upper surface which is the farthest from the first conductive electrode 1156 on the undoped semiconductor layer 1153a.

In addition, the semiconductor light emitting device 1050 includes an insulating portion 1158 formed to cover the second conductive electrode 1152. The insulating portion 1158 covers part of the first conductive semiconductor layer 1155 along with the second conductive electrode 1152. The second conductive electrode 1152 and the active layer 1154 are also formed on one surface of the second conductive semiconductor layer 1153, and disposed to be separated from each other in one direction by interposing the insulating portion 1158 therebetween. Here, one direction (or horizontal direction) is a width direction of the semiconductor light emitting device, and the vertical direction is a thickness direction of the semiconductor light emitting device.

In addition, as shown in FIG. 12, the first conductive electrode 1156 is formed on a portion exposed without being covered by the insulating portion 1158 on the first conductive semiconductor layer 1155. Accordingly, the first conductive electrode 1156 is exposed to an outside through the insulating portion 1158. As described above, the first and second conductive electrodes 1152 and 1156 are separated by the insulating layer 1058, and an n-type electrode and a p-type electrode of the semiconductor light emitting device can be insulated.

The display device 1000 also includes a phosphor layer 1080 (refer to FIG. 11B) formed on one surface of a plurality of semiconductor light emitting devices 1050. In this instance, light emitted from the semiconductor light emitting devices is excited using phosphors to implement red (R) and green (G). The foregoing black matrix 191, 291, 1091 (refer to FIGS. 3B, 8 and 11B) prevent color mixture between phosphors. Thus, embodiments of the present disclosure facilitate the structure and fabrication process of the display device and increase the luminance thereof.

Hereinafter, the structure of a display device according to an embodiment of the present disclosure for increasing luminance will be described in detail with reference to the accompanying drawings. In particular, FIG. 13 is an enlarged view illustrating a portion "A" of FIG. 1 according to another embodiment of the present disclosure, FIG. 14 is a cross-sectional view taken along line G-G in FIG. 13, and FIG. 15 is a cross-sectional view taken along line H-H in FIG. 13.

Figure 13:
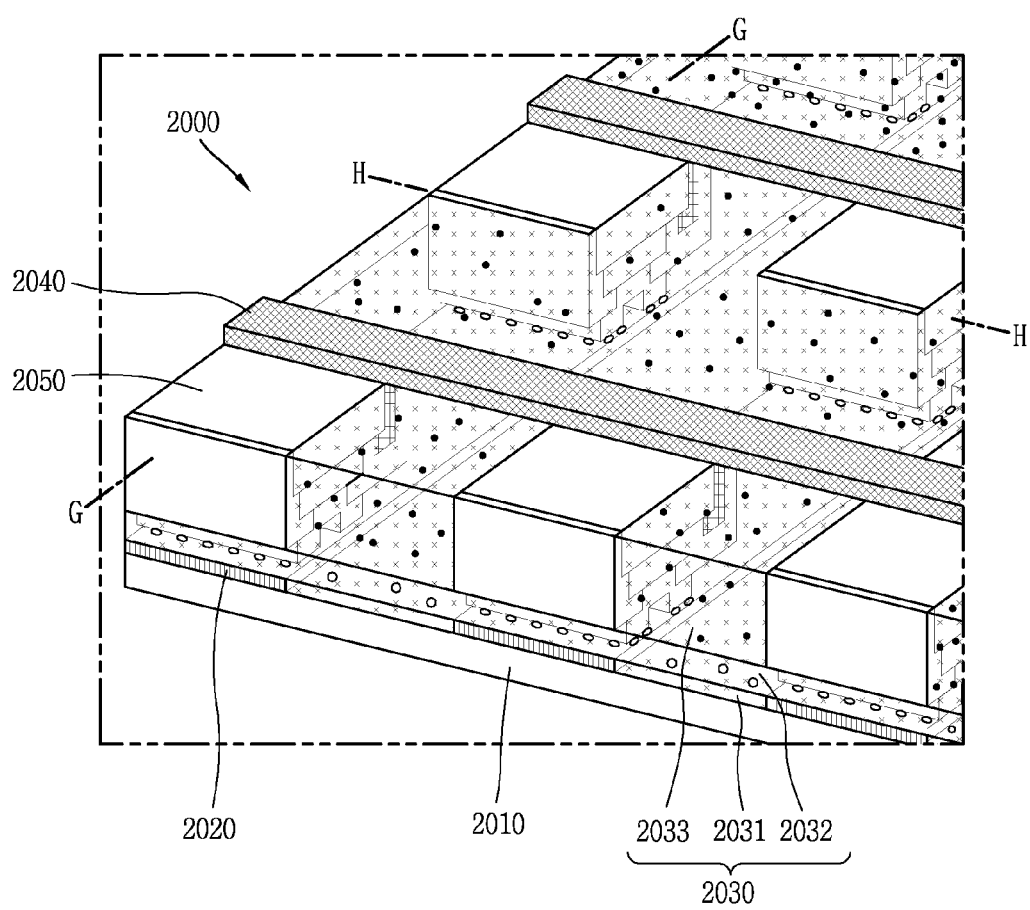
FIG. 13 is an enlarged view illustrating a portion "A" of FIG. 1 illustrating another embodiment of the present disclosure.
Figure 14:
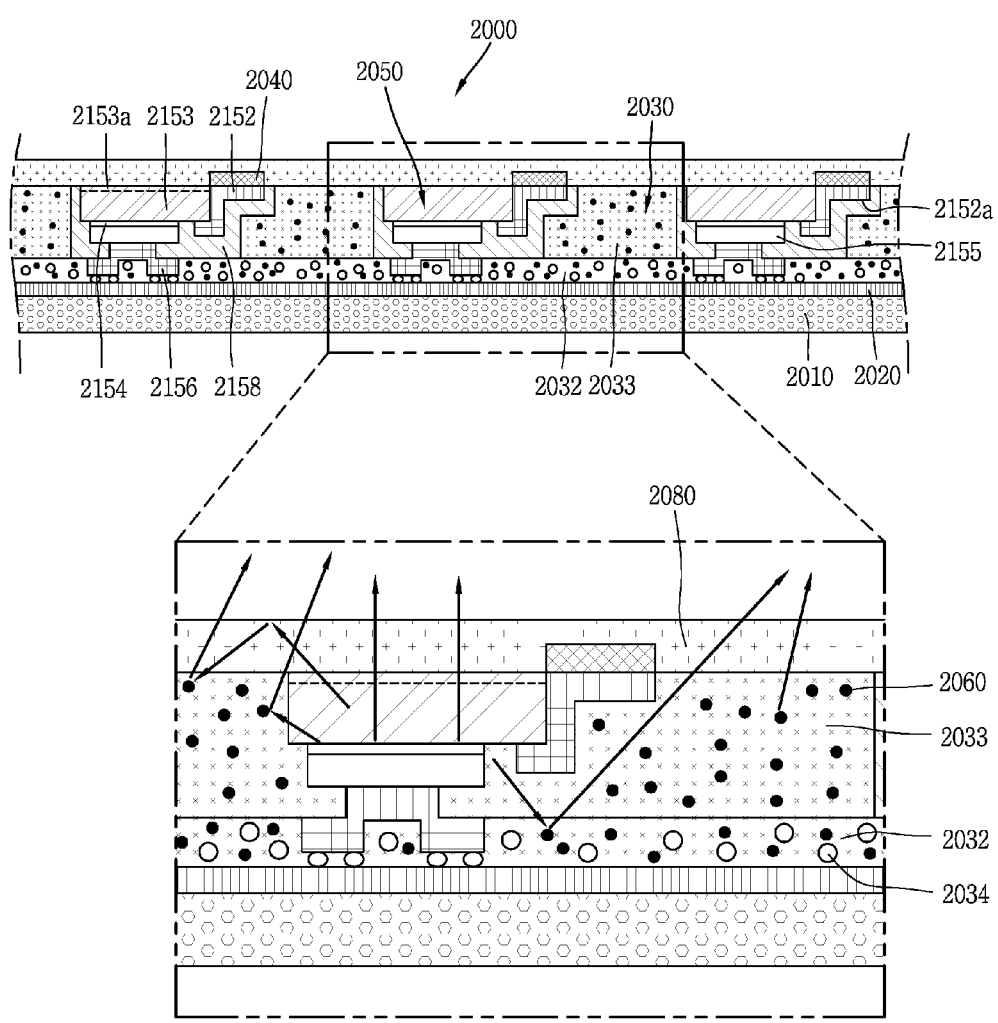
FIG. 14 is a cross-sectional view taken along line G-G in FIG. 13.
Figure 15:
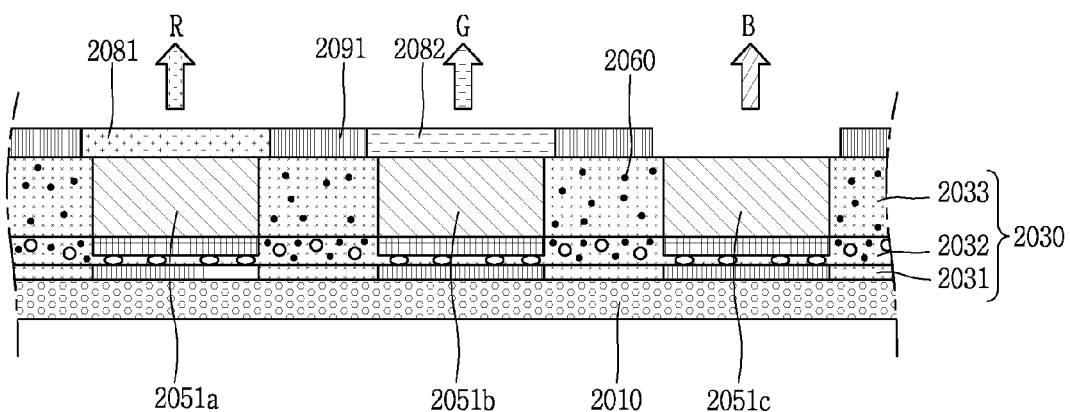
FIG. 15 is a cross-sectional view taken along line H-H in FIG. 13.

As shown in FIGS. 13 to 15, a display device 2000 using a flip chip type semiconductor light emitting device described with reference to FIGS. 10 through 12 is illustrated. More specifically, a mechanism for increasing luminance is added to a flip chip type semiconductor light emitting device described with reference to FIGS. 10 through 12 is illustrated. In this instance, an arrow illustrated in FIG. 14 indicates a path of light for increasing luminance.

According to the present example described below, the same or similar reference numerals are designated to the same or similar configurations to each configuration of the foregoing example described with reference to FIGS. 10 through 12. For example, the display device 2000 includes a substrate 2010, a first electrode 2020, a conductive adhesive layer 2030, a second electrode 2040 and a plurality of semiconductor light emitting devices 2050, and the description thereof can be substituted by the description with reference to FIGS. 10 through 12.

In this instance, the semiconductor light emitting device 2050 include a first conductive electrode 2156, a first conductive semiconductor layer 2155 formed with the first conductive electrode 2156, an active layer 2154 formed on the first conductive semiconductor layer 2155, a second conductive semiconductor layer 2153 formed on the active layer 2154, and a second conductive electrode 2152 formed on the second conductive semiconductor layer 2153, and the description thereof can be substituted by the earlier description of FIG. 12.

Furthermore, as described above with reference to FIG. 12, a protrusion portion 2152a is extended from one surface of the second conductive semiconductor layer 2153 to a lateral surface thereof, and extended to an upper surface of the second conductive semiconductor layer 2153, more specifically, an undoped semiconductor layer 2153a. Accordingly, the protrusion portion 2152a can be electrically connected to the second electrode 2040 at an opposite side of the first conductive electrode based on the second conductive semiconductor layer.

The semiconductor light emitting device 2050 also includes an insulating portion 2158 covering the second conductive electrode 2152. The insulating portion 2158 can be formed to cover part of the first conductive semiconductor layer 2155 along with the second conductive electrode 2152.

Further, the first conductive electrode 2156 is formed on a portion exposed without being covered by the insulating portion 2158 on the first conductive semiconductor layer 2155. Accordingly, the first conductive electrode 2156 is exposed to an outside through the insulating portion 2158. The display device 2000 may further include a phosphor layer 2080 fondled on one surface of a plurality of semiconductor light emitting device 2050.

For example, the semiconductor light emitting device 2050 is a blue semiconductor light emitting device for emitting blue (B) light, and the phosphor layer 2080 performs a function of converting the blue (B) light to the color of a sub-pixel. In this instance, light emitted from the semiconductor light emitting devices 2050 is excited using phosphors to implement red (R) and green (G). In addition, the phosphor layer 2080 may be substituted by a color filter, a quantum dot or the like. A black matrix 2091 prevents color mixture between phosphors. A red phosphor layer 2081, a green phosphor layer 2082 and blue semiconductor light emitting devices 2051a, 2051b and 2051c are also shown in FIG. 15.

In addition, the conductive adhesive layer 2030 is electrically connected between the substrate 2010 and the semiconductor light emitting devices 2050 while adhering the semiconductor light emitting devices 2050 to the substrate 2010 (wiring substrate). In this instance, the conductive adhesive layer 2030 may be an anisotropic conductive film.

For example, the first electrode 2020 is disposed on the substrate 2010, and thus becomes a wiring electrode. The first electrode 2020 can be electrically connected to the semiconductor light emitting device 2050 through an anisotropic conductive medium 2034 of the conductive adhesive layer 2030, and driven as a data electrode for transmitting a data signal.

Further, the second electrode 2040 is located on the conductive adhesive layer 2030. In other words, the conductive adhesive layer 2030 is disposed between the wiring substrate and the second electrode 2040. The second electrode 2040 can be electrically connected to the semiconductor light emitting device 2050 by contact, and driven as a scan electrode for transmitting a scan signal. However, the present disclosure is not limited to this, the first electrode 2020 can be a scan electrode, and the second electrode 2040 can be a data electrode.

According to the present embodiment, the conductive adhesive layer 2030 includes a plurality of layers 2031, 2032, 2033, and white pigment 2060 is included in at least one of the plurality of layers. The white pigment 2060 is intermixed within the conductive adhesive layer 2030 to reflect light emitted from the semiconductor light emitting devices 2050.

In addition, the white pigment 2060 may include at least one of titanium oxide, alumina, magnesium oxide, antimony oxide, zirconium oxide, and silica. More specifically, the conductive adhesive layer 2030 may include a first layer 2031, a second layer 2032 and a third layer 2033. The first layer 2031 is a layer disposed on the substrate 2010, and configured to have an adhesion adhered to the substrate 2010. The first layer may be formed of a material with a sufficient fluidity to be adequate to an adhesion process.

Further, the first layer 2031 is not a portion being directly brought into contact with the semiconductor light emitting device, and thus may not include white pigment. Thus, the adhesion deterioration of the first layer 2031 can be mitigated or prevented since white pigment is not included or contained therein.

In addition, the second layer 2032 includes the anisotropic conductive medium 2034 as a layer deposited on the first layer 2031. At least part of the semiconductor light emitting device may be inserted into at least part of the second layer 2032. Thus, the anisotropic conductive medium 2034 is brought into contact with the first conductive electrode 2156 of the semiconductor light emitting device to electrically conduct between the light emitting device and the wiring electrode of the substrate.

In this instance, the white pigment 2060 may be included or contained in the second layer 2032 to reflect light emitted from the semiconductor light emitting devices 2050. For example, the white pigment 2060 may be infiltrated into an insulating base member or base material of the conductive adhesive layer 2030.

In addition, the second layer may include a material with a higher viscosity at a molten state than that of the first layer 2031. The second layer 2032 efficiently suppresses the flow of an anisotropic conductive medium to the maximum contrary to the first layer 2031, and thus has a high melt viscosity characteristic.

As molecular weight increases, melt viscosity increases, and thus the second layer 2032 can be formed of a thermoplastic resin with a higher molecular weight than that of the first layer 2031. For example, the second layer 2032 may include at least one of styrene-butadiene rubber, styrene-ethylene-butylene-styrene (SEBS) ethylene-vinyl acetate copolymer, carboxyl modified ethylene-vinyl acetate copolymer, ethylene-isobutyl acrylate copolymer, polyamide, polyimide, polyester, polyvinyl ether, polyvinyl butyral, polyurethane, styrene-butadiene-styrene (SBS) block copolymer, carboxyl-modified SBS copolymer, SIS copolymer, SEBS copolymer, maleic acid-modified SEBS copolymer, polybutadiene rubber, chloroprene rubber, carboxyl-modified chloroprene rubber, styrene-butadiene rubber, isobutylene-isoprene copolymer, acrylonitrile-butadiene rubber, carboxy-modified acrylonitrile-butadiene rubber, and amine-modified acrylonitrile-butadiene rubber.

In addition, the third layer 2033 may be a layer on which the anisotropic conductive medium is not disposed as a layer deposited on the second layer 2032. The second electrode 2040 is also disposed on one surface of the third layer 2033. In addition, the second layer 2032 is disposed between the first layer 2031 and the third layer 2033, and the semiconductor light emitting device is adhered to the third layer 2033. In this instance, the first layer 2031 and the third layer can be formed of the same material, and the second layer 2032 can be formed of a different material from those of the first layer 2031 and the third layer.

In addition, at least part of the semiconductor light emitting device passes through the third layer 2033, and thus the semiconductor light emitting device directly faces the third layer 2033. In this instance, the white pigment 2060 can be included or contained in the third layer 2033 to reflect light emitted from the semiconductor light emitting device. Thus, the third layer increases the reflectivity of light generated from the light emitting device through the white pigment 2060.

Also, the white pigment 2060 can be added only to the second layer 2032 and third layer 2033, and thus a reflection effect can be provided only to a layer being directly brought into contact with the semiconductor light emitting device to exhibit a luminance enhancement effect. Further, the white pigment 2060 reflects light reflected from the phosphor layer 2080 and directed toward an inside of the display device to the phosphor layer 2080. In this instance, the white pigment of the third layer 2033 primarily re-reflects light reflected from the phosphor layer 2080 and directed toward an inside of the display device.

The white pigment 2060 can also be added only to the second portion 2032 and third layer 2033, and a layer adhered to the substrate among the plurality of layers may be a layer with a higher adhesion than those of other layers. In addition, the primary function of the first layer 2031 is to enhance fillability or adhesiveness due to the unevenness of electrodes on the wiring substrate than the reflection effect, and thus white pigment is not added thereto. However, the present disclosure is not limited to this, and a small amount of white pigment may be added to the first layer 2031. In this instance, a weight ratio of white pigment added to the second layer 2032 or the third layer 2033 is greater than that of the first layer 2031.

The following Table 1 exhibits an experimental result in which the content of white pigment varies with the use of the structure of the present embodiment.

|  |  | Embodiment 1 | Embodiment 2 | Embodiment 3 | Comparative example 1 | Comparative example 2 |
|---|---|---|---|---|---|---|
| Content of white pigment | Third layer | 10 | 25 | 40 | 0 | 5 |
|  | Second layer | 10 | 25 | 40 | 0 | 5 |
|  | First layer | 0 | 0 | 0 | 0 | 0 |
| Reflectivity (%) |  | 24.5% | 31.3% | 37.7% | 7.8% | 13.1% |
| Luminous efficiency |  | 134% | 156% | 176% | 100% | 108% |

Further, a weight ratio of white pigment included in the second layer 2032 may be 10 to 80 wt % with respect to a gross weight of the second layer. And a weight ratio of white pigment included in the third layer may be 10 to 80 wt % with respect to a gross weight of the third layer. Due to the experiment result, reflectivity tends to rapidly increase based on the addition of white pigment up to 10 wt %, and proportionally increase. However, increasing luminous efficiency more than 50% has a technical significance, and thus a weight ratio of white pigment is preferably more than 20 wt %.

Furthermore, when too much white pigment is added, fluidity may decrease, and a surface defect due to particles may occur, and thus a weight ratio of white pigment is preferably less than 60 wt %. According to an embodiment of the present disclosure, a weight ratio of white pigment included in the second layer 2032 is 20 to 60 wt %, and a weight ratio of white pigment included in the third layer 2033 is 20 to 60 wt %.

As described above, the present embodiment clearly defines the structure of a conductive adhesive layer and the content of white pigment, thereby implementing a connection structure capable of increasing flexibility as well as maintaining adhesion in a display device using the semiconductor light emitting device.

Further, illustrations described below may be also applicable to a display device using the foregoing different type of semiconductor light emitting device. As described above, a display device using the foregoing semiconductor light emitting device may be modified in various forms, and such a modified example will be described below.

Figure 16:
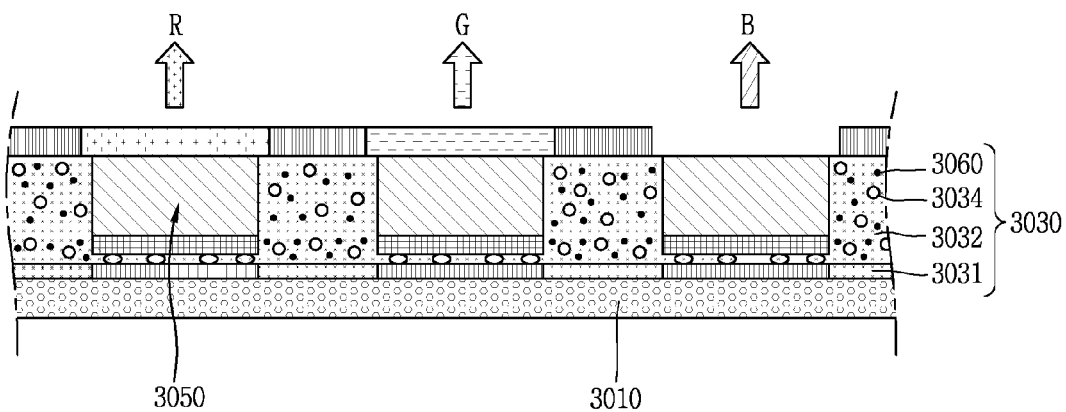
FIGS. 16 and 17 are conceptual views illustrating other examples of the present disclosure.
Figure 17:
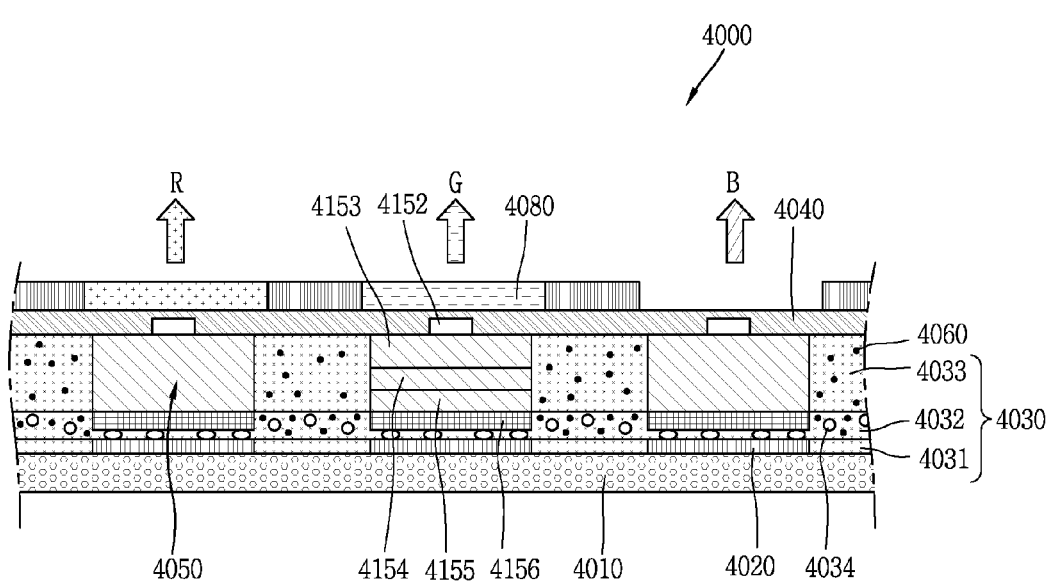

Next, FIGS. 16 and 17 are conceptual views illustrating other examples of the present disclosure. First, according to the illustration of FIG. 16, a conductive adhesive layer 3030 includes two layers, and is electrically connected between the substrate 3010 and the semiconductor light emitting devices 3050 while the semiconductor light emitting devices 3050 are adhered to the substrate 3010 (wiring substrate).

According to the present embodiment, the conductive adhesive layer 3030 include a plurality of layers 3031 and 3032, and white pigment 3060 is added to any one of the plurality of layers but not added to the other one. In addition, the white pigment 3060 may include at least one of titanium oxide, alumina, magnesium oxide, antimony oxide, zirconium oxide, and silica.

More specifically, the conductive adhesive layer 3030 includes a first layer 3031 and a second layer 3032. The first layer 3031 is disposed on the substrate 3010, and configured to have an adhesion adhered to the substrate 3010. The first layer may also be formed of a material with a good fluidity to be adequate to an adhesion process. Further, the first layer 3031 is not a portion being directly brought into contact with the semiconductor light emitting device 3050, and thus may not include white pigment. Thus, the adhesion deterioration of the first layer 3031 can be mitigated or prevented since white pigment is not included therein.

In addition, the second layer 3032 is disposed with the anisotropic conductive medium 3034 as a layer deposited on the first layer 3031. Furthermore, a second electrode electrically connected to a second conductive electrode of the semiconductor light emitting device is disposed on one surface of the second layer 3032.

In addition, at least part of the semiconductor light emitting device can be inserted into at least part of the second layer 3032. Thus, the anisotropic conductive medium 3034 is brought into contact with the first conductive electrode 2156 of the semiconductor light emitting device 3050 to electrically conduct between the light emitting device 3050 and the wiring electrode of the substrate 3010.

Further, the white pigment 3060 is included in the second layer 3032 to reflect light emitted from the semiconductor light emitting devices 3050. For example, the white pigment 3060 can be infiltrated into an insulating base member or base material of the conductive adhesive layer 3030. Thus, the white pigment 3060 can be added only to the second layer 3032, and thus a reflection effect can be provided only to a layer being directly brought into contact with the semiconductor light emitting device to exhibit a luminance enhancement effect.

In addition, the white pigment 3060 can be added only to the second portion 3032, and the first layer 3031 can be a layer with a higher adhesion than the second layer 3032. Also, the primary function of the first layer 3031 is to enhance fillability or adhesiveness due to the unevenness of electrodes on the wiring substrate than the reflection effect, and thus white pigment is not added thereto. However, the present disclosure is not limited to this, and a small amount of white pigment may be added to the first layer 3031. In this instance, a weight ratio of white pigment added to the second layer 3032 is greater than that of the first layer 3031.

Next, according to the illustration of FIG. 17, for a vertical type semiconductor light emitting device, it is possible to increase luminous efficiency due to the structure of the conductive adhesive layer of the present disclosure. As shown, a display device 4000 includes a substrate 4010, a first electrode 4020, a conductive adhesive layer 4030, a second electrode 4040 and a plurality of semiconductor light emitting devices 4050. Here, the first electrode 4020 and second electrode 4040 may include a plurality of electrode lines, respectively.

The substrate 4010 as a wiring substrate is formed of a flexible insulating material similarly to that of a display device to which the foregoing flip chip type light emitting device is applied, and the first electrode 4020 is disposed thereon. The first electrode 4020 as a bar shaped electrode elongated in one direction may be formed to perform the role of a data electrode similarly to a display device to which the foregoing flip chip type light emitting device is applied.

A plurality of second electrodes 4040 disposed in a direction crossing a length direction of the first electrode 4020, and electrically connected to the semiconductor light emitting device 4050 are located between the semiconductor light emitting devices 4050. In addition, a plurality of semiconductor light emitting devices 4050 may form a plurality of columns in a direction in parallel to a plurality of electrode lines provided on the first electrode 4020. However, the present disclosure is not limited to this. For example, the plurality of semiconductor light emitting devices 4050 may form a plurality of columns along the second electrode 4040.

Moreover, the display device 4000 may further include a phosphor layer 4080 formed on one surface of the plurality of semiconductor light emitting devices 4050. The description thereof will be substituted by the description of the phosphor layer with reference to FIGS. 10, 11A and 11B. Further, referring to the semiconductor light emitting device 4050 according to the present embodiment, the semiconductor light emitting device 4050 in the present embodiment has a vertical type structure, and electrodes are disposed at the top/bottom, thereby having an advantage of reducing the chip size.

For example, the semiconductor light emitting device 4050 may include a first conductive electrode 4156, a first conductive semiconductor layer 4155 formed with the first conductive electrode 4156, an active layer 4154 formed on the first conductive semiconductor layer 4155, and a second conductive semiconductor layer 4153 formed on the active layer 4154. In addition, the active layer 4154 is formed at one side of the second conductive semiconductor layer 4153, and the second electrode 4040 is connected to the other side thereof.

The present illustration illustrates a second conductive electrode 4152 is not additionally provided on each semiconductor light emitting device 4050, but the second conductive electrode 4152 is integrally formed with the second electrode 4040. In this instance, the second electrode 4152 may be formed without the process of depositing the second conductive electrode 4152 on each semiconductor light emitting device 4050.

In this instance, the first conductive electrode 4156 and first conductive semiconductor layer 4155 may be a p-type electrode and a p-type semiconductor layer, respectively, and the second electrode 4040 and second conductive semiconductor layer 4153 may be an n-type electrode and an n-type semiconductor layer, respectively. More specifically, the first conductive semiconductor layer 4155 may be a p-type GaN layer and the second conductive semiconductor layer 4153 may be an n-type GaN layer.

The conductive adhesive layer 4030 is formed on the substrate 4010 at which the first electrode 4020 is located. In addition, the second electrode 4040 may be located on the conductive adhesive layer 4030. In other words, the conductive adhesive layer 4030 is disposed between the wiring substrate and the second electrode 4040. The second electrode 4040 may be electrically connected to the semiconductor light emitting device 4050 by contact.

Due to the foregoing structure, the conductive adhesive layer 4030 is electrically connected between the substrate 4010 and the semiconductor light emitting devices 4050 while adhering the semiconductor light emitting devices 4050 to the substrate 4010 (wiring substrate). For example, the first electrode 4020 is disposed on the substrate 4010, and thus becomes a wiring electrode. The first electrode 4020 can be electrically connected to the semiconductor light emitting device 4050 through an anisotropic conductive medium 4034 of the conductive adhesive layer 4030, and driven as a data electrode for transmitting a data signal.

In addition, the second electrode 4040 is located on the conductive adhesive layer 4030. In other words, the conductive adhesive layer 4030 is disposed between the wiring substrate and the second electrode 4040. The second electrode 4040 may be electrically connected to the semiconductor light emitting device 4050 by contact, and driven as a scan electrode for transmitting a scan signal.

According to the present embodiment, the conductive adhesive layer 4030 is provided with a plurality of layers 4031, 4032, 4033, and white pigment 4060 is added to at least one of the plurality of layers. The white pigment 4060 is intermixed within the conductive adhesive layer 4030 to reflect light emitted from the semiconductor light emitting devices 4050. In this instance, the white pigment 4060 may include at least one of titanium oxide, alumina, magnesium oxide, antimony oxide, zirconium oxide, and silica.

More specifically, the conductive adhesive layer 4030 may include a first layer 4031, a second layer 4032 and a third layer 4033. The first layer 4031, second layer 4032 and third layer 4033 may have the same structure and material as those of layers in the foregoing illustration described with reference to FIGS. 13 through 15, and the description thereof will be substituted by the earlier description.

Thus, the first layer may not be a portion being directly brought into contact with the semiconductor light emitting device, and thus may not include white pigment. On the contrary, the second layer 4032 may include the white pigment 4060 to reflect light emitted from the semiconductor light emitting devices 4050. The third layer 4033 may not be disposed with the anisotropic conductive medium but may include the white pigment 4060 to reflect light emitted from the semiconductor light emitting devices 4050.

The white pigment 4060 may be added only to the second layer 4032 and third layer 4033, and thus a reflection effect can be provided only to a layer being directly brought into contact with the semiconductor light emitting device to exhibit a luminance enhancement effect. Furthermore, even in a display device using a vertical type semiconductor light emitting device as illustrated in the present embodiment, the white pigment 4060 may perform the role of re-reflecting light reflected from the phosphor layer 4080 and directed toward an inside of the display device to the phosphor layer 4080. In this instance, the white pigment of the third layer 4033 may primarily perform the role of re-reflecting light reflected from the phosphor layer 4080 and directed toward an inside of the display device.

The white pigment 4060 can be added only to the second portion 4032 and third layer 4033, and a layer adhered to the substrate among the plurality of layers may be a layer with a higher adhesion than those of other layers. However, the present disclosure is not limited to this, and a small amount of white pigment may be added to the first layer 4031. In this instance, as illustrated in the present embodiment, a weight ratio of white pigment added to the second layer 4032 or the third layer 4033 may be greater than that of the first layer 4031.

As described above, the structure of a conductive adhesive layer According to an embodiment of the present disclosure may be also applied to a display device using a vertical type semiconductor light emitting device, thereby implementing a connection structure capable of increasing flexibility as well as maintaining adhesion.

In a display device according to the present disclosure, white pigment may be added to the conductive adhesive layer to thereby guide the luminous light of semiconductor light emitting devices to the top. In this case, the conductive adhesive layer may be provided with a plurality of layers having different contents of white pigment, thereby implementing a connection structure capable of increasing flexibility as well as maintaining adhesion.

Furthermore, according to the present disclosure, white pigment may be added to only some of the layers of the conductive adhesive layer, thereby implementing the luminance enhancement of the display device even with a simple fabrication process. Furthermore, the plurality of layers may be provided with different materials, thereby implementing a conductive adhesive layer having both fluidity and viscosity required in relation with the surrounding structures.

In addition, the conductive adhesive layer may be formed with a structure in which an appropriate amount of white pigment is added to a portion that requires white pigment, thereby reducing fabrication cost.

The configurations and methods according to the above-described embodiments will not be applicable in a limited way to the foregoing display device using a semiconductor light emitting device, and all or part of each embodiment may be selectively combined and configured to make various modifications thereto.

What is claimed is:

1. A display device, comprising:
   a substrate including a wiring electrode;
   a conductive adhesive layer including an anisotropic conductive medium, and disposed to cover the wiring electrode; and
   a plurality of semiconductor light emitting devices adhered to the conductive adhesive layer, and electrically connected to the wiring electrode through the anisotropic conductive medium,
   wherein the conductive adhesive layer comprises:
   a first layer disposed on the substrate;
   a second layer deposited on the first layer, and including the anisotropic conductive medium; and
   a third layer deposited on the second layer, to which the semiconductor light emitting devices are adhered, and
   wherein at least one of the second layer and the third layer includes a white pigment configured to reflect light emitted by the semiconductor light emitting device, and
   wherein the second layer is formed of a thermoplastic resin with a higher molecular weight than that of the first layer.

2. The display device of claim 1, wherein each semiconductor light emitting device comprises:
   a first conductive electrode;
   a first conductive semiconductor layer formed on the first conductive electrode;
   an active layer formed on the first conductive semiconductor layer;
   a second conductive semiconductor layer formed on the active layer; and
   a second conductive electrode formed on the second conductive semiconductor layer.

3. The display device of claim 2, wherein the second conductive semiconductor layer includes an undoped semiconductor layer formed on a surface farthest from the substrate.

4. The display device of claim 3, wherein the first conductive electrode and the second conductive electrode are formed to have a height difference in a width direction and a thickness direction at a separated position along the width direction of the semiconductor light emitting device.

5. The display device of claim 4, wherein at least part of the second conductive electrode protrudes along the width direction from a lateral surface of the undoped semiconductor layer, is exposed to an upper side of the semiconductor light emitting device, and is disposed at a position overlapping with the second electrode disposed at an upper side of the conductive adhesive layer and electrically connected to the second electrode at an opposite side to the first conductive electrode based on the second semiconductor layer.

6. The display device of claim 1, wherein the white pigment is not included in the first layer, and is included in the second layer and the third layer.

7. The display device of claim 6, wherein a weight ratio of the white pigment included in the second layer is 20 to 60 wt %, and a weight ratio of the white pigment included in the third layer is 20 to 60 wt %.

8. The display device of claim 1, wherein the second layer is formed of a material with a higher viscosity at a molten state than that of the third layer.

9. The display device of claim 1, wherein the thermoplastic resin comprises at least one of styrene-butadiene rubber, styrene-ethylene-btylene-styrene (SEBS) ethylene-vinyl acetate copolymer, carboxyl modified ethylene-vinyl acetate copolymer, ethylene-isobutyl acrylate copolymer, polyamide, polyimide, polyester, polyvinyl ether, polyvinyl butyral, polyurethane, styrene-butadiene-styrene (SBS) block copolymer, carboxyl-modified SBS copolymer, SIS copolymer, SEBS copolymer, maleic acid-modified SEBS copolymer, polybutadiene rubber, chloroprene rubber, carboxyl-modified chloroprene rubber, styrene-butadiene rubber, isobutylene-isoprene copolymer, acrylonitrile-butadiene rubber, carboxy-modified acrylonitrile-butadiene rubber, and amine-modified acrylonitrile-butadiene rubber.

10. The display device of claim 1, wherein the first layer and the third layer are formed of the same material, and the second layer is formed of a different material from that of the first layer and third layer.

11. The display device of claim 1, wherein the first layer adhered to the substrate has a higher adhesion than that of the second layer and the third layer.

12. The display device of claim 1, wherein the white pigment comprises at least one of titanium oxide, alumina, magnesium oxide, antimony oxide, zirconium oxide, and silica.

13. An anisotropic conductive film, comprising:
   a first layer having an adhesion for adhesion to a wiring substrate of a display device including a plurality of semiconductor light emitting devices;
   a second layer deposited on the first layer, and including white pigment configured to reflect light from the semiconductor light emitting devices and including an anisotropic conductive medium configured to electrically connect the wiring substrate to the semiconductor light emitting devices; and
   a third layer deposited on the second layer and having an adhesion and the white pigment,
   wherein the second layer is formed of a thermoplastic resin with a higher molecular weight than that of the first layer.

14. The anisotropic conductive film of claim 13, wherein the white pigment is not included in the first layer.

15. The anisotropic conductive film of claim 13, wherein a weight ratio of the white pigment included in the second layer is 20 to 60 wt %, and a weight ratio of the white pigment included in the third layer is 20 to 60 wt %.

16. The anisotropic conductive film of claim 13, wherein the second layer is formed of a material with a higher viscosity at a molten state than that of the third layer.

17. The anisotropic conductive film of claim 13, wherein the thermoplastic resin comprises at least one of styrene-butadiene rubber, styrene-ethylene-btylene-styrene (SEBS) ethylene-vinyl acetate copolymer, carboxyl modified ethylene-vinyl acetate copolymer, ethylene-isobutyl acrylate copolymer, polyamide, polyimide, polyester, polyvinyl ether, polyvinyl butyral, polyurethane, styrene-butadiene-styrene (SBS) block copolymer, carboxyl-modified SBS copolymer, SIS copolymer, SEBS copolymer, maleic acid-modified SEBS copolymer, polybutadiene rubber, chloroprene rubber, carboxyl-modified chloroprene rubber, styrene-butadiene rubber, isobutylene-isoprene copolymer, acrylonitrile-butadiene rubber, carboxy-modified acrylonitrile-butadiene rubber, and amine-modified acrylonitrile-butadiene rubber.

* * * * *